United States Patent
Klaimi et al.

(10) Patent No.: US 11,831,339 B2
(45) Date of Patent: Nov. 28, 2023

(54) METHOD FOR GENERATING A SIGNAL BY MEANS OF A TURBO-ENCODER, AND CORRESPONDING DEVICE AND COMPUTER PROGRAM

(71) Applicant: ORANGE, Issy-les-Moulineaux (FR)

(72) Inventors: Rami Klaimi, Chatillon (FR); Catherine Douillard, Chatillon (FR); Charbel Abdel Nour, Chatillon (FR)

(73) Assignee: Orange, Issy-les-Moulineaux (FR)

( * ) Notice: Subject to any disclaimer, the term of this patent is extended or adjusted under 35 U.S.C. 154(b) by 0 days.

(21) Appl. No.: 17/416,141

(22) PCT Filed: Dec. 12, 2019

(86) PCT No.: PCT/FR2019/053048
§ 371 (c)(1),
(2) Date: Jun. 18, 2021

(87) PCT Pub. No.: WO2020/128248
PCT Pub. Date: Jun. 25, 2020

(65) Prior Publication Data
US 2022/0060198 A1  Feb. 24, 2022

(30) Foreign Application Priority Data
Dec. 20, 2018  (FR) ...................................... 1873615

(51) Int. Cl.
*H03M 13/27*  (2006.01)
*H03M 13/15*  (2006.01)
(Continued)

(52) U.S. Cl.
CPC ... *H03M 13/2771* (2013.01); *H03M 13/2714* (2013.01); *H03M 13/2725* (2013.01);
(Continued)

(58) Field of Classification Search
CPC ......... H03M 13/2771; H03M 13/2714; H03M 13/2725
See application file for complete search history.

(56) References Cited

U.S. PATENT DOCUMENTS 6,023,783 A * 2/2000 Divsalar ................. H04L 1/005
                                                  375/264
6,334,197 B1 * 12/2001 Eroz ................. H03M 13/2771
                                                  714/701
(Continued)

OTHER PUBLICATIONS

Delay Operator, Encyclopedia of Physical Science and Technology (3rd Edition), 2003 https://www.sciencedirect.com/topics/mathematics/delay-operator (Year: 2003).*

(Continued)

*Primary Examiner* — Joseph D Torres
(74) *Attorney, Agent, or Firm* — David D. Brush; Westman, Champlin & Koehler, P.A.

(57) ABSTRACT

A method for generating a signal, including turbo-coding a set of information symbols delivering, on the one hand, the information symbols and, on the other hand, redundancy symbols. The turbo-coding implementing, to obtain the redundancy symbols: an encoding of the set of information symbols by a first encoder, an interleaving of the set of information symbols, and an encoding of the set of information symbols interleaved by a second encoder. The turbo-coding also implements a bijective transformation of the information symbols, implemented before and/or after the interleaving, the transformation modifying a value of at least two of the information symbols prior to the coding of the information symbols by the first and/or the second coder.

10 Claims, 6 Drawing Sheets

(51) Int. Cl.
   *H03M 13/29*   (2006.01)
   *H03M 13/00*   (2006.01)
(52) U.S. Cl.
   CPC .... *H03M 13/1565* (2013.01); *H03M 13/2903* (2013.01); *H03M 13/2963* (2013.01); *H03M 13/6306* (2013.01); *H03M 13/6516* (2013.01)

(56) References Cited

U.S. PATENT DOCUMENTS

| | | | | |
|---|---|---|---|---|
| 6,427,214 | B1* | 7/2002 | Li | H03M 13/2742 |
| | | | | 714/701 |
| 8,549,376 | B1* | 10/2013 | Ahmed | H03M 13/6561 |
| | | | | 714/755 |
| 2002/0124221 | A1* | 9/2002 | Goldman | H03M 13/2771 |
| | | | | 714/755 |
| 2002/0159423 | A1* | 10/2002 | Yao | H04L 5/023 |
| | | | | 370/441 |
| 2006/0159195 | A1* | 7/2006 | Ionescu | H04L 1/065 |
| | | | | 375/267 |
| 2011/0317651 | A1* | 12/2011 | Siaud | H04L 5/0007 |
| | | | | 370/329 |
| 2016/0036609 | A1* | 2/2016 | Ahn | H04L 27/362 |
| | | | | 370/329 |
| 2016/0285588 | A1* | 9/2016 | Hald | H04L 1/0002 |

OTHER PUBLICATIONS

David Cherney, Tom Denton, Rohit Thomas and Andrew Waldron; Linear Algebra; 1st Edition, Davis California, 2013 (Year: 2013).*
W. Cary Huffman, and Vera Pless; Fundamentals of Error-Correcting Codes; Cambridge University Press, 2003 (Year: 2003).*
International Search Report dated Mar. 18, 2020 for corresponding International Application No. PCT/FR2019/053048, Dec. 12, 2019.
Written Opinion of the International Searching Authority dated Mar. 18, 2020 for corresponding International Application No. PCT/FR2019/053048, filed Dec. 12, 2019.
Matsumine Toshiki et al., "Capacity-Approaching Non-Binary Turbo Codes: A Hybrid Design Based on EXIT Charts and Union Bounds" IEEE Access, vol. 6, Nov. 14, 2018 (Nov. 14, 2018), pp. 70952-70963, DOI: 10.1109/ACCESS.2018.2881243, XP011699389.
Klaimi Rami et al. "Design of Low-Complexity Convolutional Codes over GF(q)" 2018 IEEE Global Communications Conference (GLOBECOM), IEEE, Dec. 9, 2018 (Dec. 9, 2018), pp. 1-7, DOI: 10.1109/GLOCOM.2018.8647824, XP033519983.
Matsumine Toshiki et al., "Capacity-Approaching Non-Binary Turbo Codes: A Hybrid Design Based on EXIT Charts and Union Bounds", IEEE Access, vol. 6, Nov. 14, 2018 (Nov. 14, 2018), pp. 70952-70963 XP011699389.
Klaimi Rami et al., "Design of Low-Complexity Convolutional Codes over GF(q)", 2018 IEEE Global Communications Conference (GLOBECOM), IEEE, Dec. 9, 2018 (Dec. 9, 2018), pp. 1-7 XP033519983.
M. C. Davey and D. J. MacKay, "Low-Density Parity Check Codes over GF(q)," IEEE Commun. Lett., vol. 2, No. 6, pp. 165-167, Jun. 1998.
C. Poulliat, M. Fossorier, and D. Declercq, "Design of Regular (2,dc)-LDPC Codes over GF(q) Using Their Binary Images," IEEE Trans. Commun., vol. 56, No. 10, pp. 1626-1635, Oct. 2008.
G. Liva, E. Paolini, B. Matuz, S. Scalise, and M. Chiani, "Short Turbo Codes over High Order Fields," IEEE Trans. Commun., vol. 61, No. 6, pp. 2201-2211, Jun. 2013.
W. Abd-Alaziz, M. Johnston, and S. Le Goff, "Non-Binary Turbo Codes on Additive Impulsive Noise Channels," 10th Int. Symp. Commun. Systems, Networks and Digital Signal Process. (CSNDSP), Prague, Czech Republic, Jul. 2016, pp. 1-5.
English translation of the Written Opinion of the International Searching Authority dated Apr. 3, 2020 for corresponding Application No. PCT/FR2019/053048, filed Dec. 12, 2019.

* cited by examiner

METHOD FOR GENERATING A SIGNAL BY MEANS OF A TURBO-ENCODER, AND CORRESPONDING DEVICE AND COMPUTER PROGRAM

CROSS-REFERENCE TO RELATED APPLICATIONS

This Application is a Section 371 National Stage Application of International Application No. PCT/FR2019/053048, filed Dec. 12, 2019, which is incorporated by reference in its entirety and published as WO 2020/128248 A1 on Jun. 25, 2020, not in English.

1. FIELD OF THE INVENTION

The field of the invention is that of digital communications, implementing a turbo-code type error correcting code.

In particular, the invention provides a new technique for generating a signal implementing a non-binary turbo-code type error correcting code.

The invention finds applications in particular in the field of wireless (DAB, DVB-T, WLAN, unguided optics, etc.) or wired (xDSL, PLC, optics, etc.) communications.

2. PRIOR ART

2.1 Binary Turbo-Coders

The error correcting codes conventionally used in digital communication systems are binary. In other words, the information symbols at the input of the encoder, and the redundancy symbols obtained at the output of the encoder, are binary elements, belonging to the Galois field GF(2).

The conventional structure of a binary turbo-coder, illustrated in FIG. 1, comprises the parallel concatenation of two encoders, for example of the recursive systematic convolutional type, C1 11 and C2 12, separated by an interleaver 13. The input digital message D, formed of K information symbols defined on GF(2), is encoded in the order of arrival of the information symbols, called natural order, by the first encoder C1 11, and in an interleaved or permuted order, by the second encoder C2 12. The digital output message comprises systematic symbols S, corresponding to the K information symbols, and parity or redundancy symbols P1 and P2, defined on GF(2).

2.2 Non-Binary Turbo-Coders

Error correcting codes can also be defined on Galois fields with cardinal q greater than 2, GF(q). The structure of a non-binary turbo-coder is similar to the structure of a binary turbo-coder. In this case, the digital input message D is formed of K information symbols defined on GF(q), and the output digital message is formed of systematic symbols S, corresponding to the K information symbols, and of parity or redundancy symbols P1 and P2, defined on GF(q).

These non-binary error correcting codes can be associated with a modulation of order p equal to q (for example, quadrature amplitude modulation q-QAM) or with a modulation of different order. In particular, the correction power of the non-binary codes is greater than the correction power of the binary codes when these codes are associated with a modulation of the same order, p equal to q (for example q-QAM).

A difference between binary and non-binary codes from the point of view of corrective power is that the low error rate performances of a binary code are dictated by its minimum Hamming distance, while the low error rate performances of a non-binary code are dictated by the minimum cumulative Euclidean distance between two coded sequences (that is to say two turbo-coder output messages), which takes into account the constellation of the p-ary modulation used.

When combined with a modulation of the same order p=q (for example q-QAM), the high signal-to-noise ratio correction power on a Gaussian additive noise channel of a non-binary convolutional code defined on GF(q), in terms of Frame Error Rate (FER), is given by the Union Bound (UB):

$$TEP \leq UB = \frac{1}{C_q^2{}^K} \sum_{d=d_{min}}^{d_{max}} n(d) Q\left(\frac{d}{2\sigma}\right) \quad \text{[Equation 1]}$$

where K is the length of the digital input messages, $C_q{}^{K2}$ is the number of combinations of pairs of digital input messages of length K, $d_{min}$ is the minimum cumulative Euclidean distance between two output messages (or code words), n(d) is the multiplicity associated with the distance d, that is to say the number of pairs of code words at the distance d from each other, σ is the variance of the Gaussian noise, and Q(•) denotes the error function:

$$Q(x) = \frac{1}{\sqrt{2\pi}} \int_x^\infty e^{-t^2/2} dt.$$

The value of the bound UB is dominated by its first terms, corresponding to the low values of the distance d, namely $d_{min}$ and the values just above.

3. DESCRIPTION OF THE INVENTION

In order to improve the performances of turbo-codes, in particular non-binary turbo-codes, it is desirable to increase the distance between the output messages. For example, it is desirable to increase the minimum cumulative Euclidean distance between two code words compared to the prior art.

For this purpose, the invention provides a method for generating a signal, comprising a step of turbo-coding a set of information symbols delivering, on the one hand, the information symbols and, on the other hand, redundancy symbols, implementing, to obtain the redundancy symbols:

an encoding of said set of information symbols by a first encoder, delivering a first set of redundancy symbols, an interleaving of said set of information symbols, delivering a set of interleaved information symbols, an encoding of said set of interleaved information symbols by a second encoder, delivering a second set of redundancy symbols.

According to the invention, the turbo-coding step also implements a bijective transformation of said information symbols, implemented before and/or after said interleaving, said transformation modifying the value of at least two of said information symbols prior to the encoding of said information symbols by the first and/or the second encoder.

In other words, the invention proposes a modification of the conventional structure of turbo-coders, based on the addition of a function for transforming the information symbols before the encoding of the input message by the first encoder or by the second encoder, and implemented either before or after interleaving.

In this way, the order of the information symbols entering on the two encoders is changed on the one hand, thanks to the interleaving, and on the other hand the value of the information symbols entering the two encoders is changed, thanks to the transformation. The coded sequences obtained at the output of the two encoders therefore do not consist of the same information and redundancy symbols.

The transformation considered is a bijection on the considered set of symbols of the Galois field: each symbol of GF(q) has a unique image in GF(q) by this transformation and every element of GF(q) has a unique antecedent in GF(q). Such a transformation therefore modifies the value of at least two information symbols.

For example, if the information symbols belong to the Galois field GF(2) and if a set of information symbols forming the input message 000000100 is considered, the set of interleaved information symbols can be 010000000 before transformation, and 101111111 after transformation (the bijective transformation transforming, in this case, information symbols of value "0" into information symbols of value "1" and vice versa). It is therefore possible to change both the order and the value of the information symbols input on the two encoders of the turbo-coder.

The overall objective of this transformation is to increase the minimum cumulative distance between two code words, for example the cumulative Euclidean distance, relative to the turbo-coder without transformation, independently of the nature of the elementary codes implemented by the first and second encoders and interleaver used.

A solution is thus proposed which allows, according to at least one embodiment, to improve the corrective power of the turbo-decoder.

In particular, the information symbols belong to a Galois field of cardinal q, denoted by GF(q), with q>2. Indeed, the implementation of a transformation function allows in particular to improve the correction performances of non-binary turbo-codes.

According to a particular embodiment, the transformation generates a minimum dispersion $\Delta_{min}$ between two information symbols $S_i$, $S_j$ among said information symbols greater than a selection threshold, such that:

$$\Delta_{min} = \min \Delta(S_i, S_j)$$

with:
$\Delta(S_i, S_j) = D(S_i, S_j) + D(T(S_i), T(S_j))$
$D(S_i, S_j)$ the distance between said information symbols $S_i$, $S_j$ before transformation,
$D(T(S_i), T(S_j))$ the distance between said information symbols $S_i$, $S_j$ after transformation by the function T.

In other words, the proposed solution seeks to maximise the cumulative gap between information symbols before transformation and information symbols after transformation.

According to a particular embodiment, the method implements a step of mapping the information and redundancy symbols onto modulation symbols associated with a constellation of order p, an information or redundancy symbol being mapped onto at least one modulation symbol, and the transformation takes into account said constellation.

In particular, the transformation takes into account the position of the modulation symbols associated with the information symbols before and after transformation, and seeks to increase the Euclidean distance between these modulation symbols compared to an implementation without transformation.

According to a first exemplary embodiment, the order p of the constellation being equal to the cardinal q of the Galois field to which the information symbols belong, each information or redundancy symbol is mapped onto a single modulation symbol.

According to this first example, the dispersion between two information symbols $S_i$, $S_j$ is expressed in the form:

$$\Delta(S_i, S_j) = d_{euc}^2(S_i^m, S_j^m) + d_{euc}^2(T(S_i)^m, T(S_j)^m)$$

with:
$d_{euc}^2(S_i^m, S_j^m) = (I_{S_i^m} - I_{S_j^m})^2 + (Q_{S_i^m} - Q_{S_j^m})^2$ the square of the Euclidean distance between the modulation symbols $S_i^m$, $S_j^m$ onto which said information symbols $S_i$, $S_j$ are mapped before transformation;

$d_{euc}^2(T(S_i)^m, T(S_j)^m) = (I_{T(S_i)^m} - I_{T(S_j)^m})^2 + (Q_{T(S_i)^m} - Q_{T(S_j)^m})^2$ the square of the Euclidean distance between the modulation symbols $T(S_i)^m$, $T(S_j)^m$ onto which are mapped said information symbols $S_i$, $S_j$ after transformation; and $I_x$ and $Q_x$ are the in-phase and quadrature components of a signal x in the considered constellation.

In other words, the distance $D(S_i, S_j)$ between the information symbols $S_i$, $S_j$ before transformation, and the distance $D(T(S_j), T(S_j))$ between the information symbols $T(S_j)$, $T(Sj)$ after transformation, are expressed in the form of squared Euclidean distance.

According to a first criterion for constructing the transformation function, the transformation transforms a pair of information symbols intended to be mapped onto a pair of modulation symbols whose Euclidean distance is less than a first threshold, into a pair of information symbols intended to be mapped onto a pair of modulation symbols whose Euclidean distance is greater than the first threshold, and vice versa.

According to a second criterion for constructing the transformation function, which can be taken individually or in combination with the first criterion, the transformation transforms an information symbol intended to be mapped onto a modulation symbol having, in the constellation, a number of neighbouring modulation symbols less than a determined number, into an information symbol intended to be mapped onto a modulation symbol having, in the constellation, a number of neighbours greater than said determined number, and vice versa.

The method can also implement a step of selecting a transformation from several available transformations, said selection taking into account said redundancy symbols and/or said interleaver.

In this case, the selection can involve properties of the trellis representative of the turbo-code.

According to a second exemplary embodiment, the order p of the constellation being less than the cardinal q of the Galois field to which said information symbols belong, each information or redundancy symbol is mapped onto n modulation symbols, with n≥2.

According to this second example, the dispersion between two information symbols $S_i$, $S_j$ is expressed in the form:

$$D(S_i, S_j) = \sum_{k=1}^{n} d_{euc}^2(S_{i,k}^m, S_{j,k}^m) = \sum_{k=1}^{n} \left[ (I_{S_{i,k}^m} - I_{S_{j,k}^m})^2 + (Q_{S_{i,k}^m} - Q_{S_{j,k}^m})^2 \right]$$

$$D(T(S_i), T(S_j)) = \sum_{k=1}^{n} d_{euc}^2(T(S_i)_k^m, T(S_j)_k^m)$$

$$= \sum_{k=1}^{n} \left[ (I_{T(S_i)_k^m} - I_{T(S_j)_k^m})^2 + (Q_{T(S_i)_k^m} - Q_{T(S_j)_k^m})^2 \right]$$

$S_{i,k}^m$ respectively $S_{j,k}^m$, for k ranging from 1 to n, the n modulation symbols associated with the information symbol $S_i$, respectively $S_j$, before transformation, $T(S_i)_k^m$, respectively $T(S_j)_k^m$, for k ranging from 1 to n, the n modulation symbols associated with the information symbol $S_i$, respectively $S_j$, after transformation, $I_x$ and $Q_x$ are the in-phase and quadrature components of a signal x in the considered constellation.

According to a first criterion for the construction of the transformation function, the transformation minimises the number of zero terms in the expression of the dispersion $\Delta(S_i, S_j)$.

The method can also implement a step of selecting a transformation from several available transformations, said selection maximising the value of the non-zero terms in the expression of the dispersion $\Delta(S_i, S_j)$.

According to one embodiment, the first encoder implements at least a first elementary code and the second encoder implements at least a second elementary code, distinct from said first elementary code. The turbo-coder can thus use elementary codes having different correcting power.

According to another embodiment, the first and second elementary codes are identical.

The invention also relates to a corresponding device for generating a signal, comprising a turbo-encoder configured for encoding a set of information symbols and delivering, on the one hand, said information symbols and, on the other hand, redundancy symbols, said turbo-encoder comprising:
- a first encoder for coding said set of information symbols, delivering a first set of redundancy symbols,
- an interleaver for interleaving said set of information symbols, delivering a set of interleaved information symbols,
- a second encoder for coding said set of interleaved information symbols, delivering a second set of redundancy symbols, The turbo-encoder also comprises a processor for applying a bijective transformation to said information symbols, implemented before and/or after said interleaver, said transformation modifying the value of at least two of said information symbols prior to the encoding of said information symbols by the first and/or the second encoder.

Such a device for generating a signal is in particular adapted to implement the generation method described above. This is, for example, a binary or non-binary turbo-coder. This device could of course include the various features relating to the generation method according to the invention, which can be combined or taken in isolation. Thus, the features and advantages of this device are the same as those of the method described above. Therefore, they are not further detailed.

The invention also relates to one or more computer programs including instructions for the implementation of a method for generating a signal as described above when this or these programs are executed by at least one processor.

The invention also relates to an information medium readable by a computer, and including instructions of a computer program as mentioned above.

4. LIST OF FIGURES

Other features and advantages of the invention will emerge more clearly upon reading the following description of a particular embodiment, given by way of simple illustrative and non-limiting example, and the appended drawings, among which:

Figure 3A:
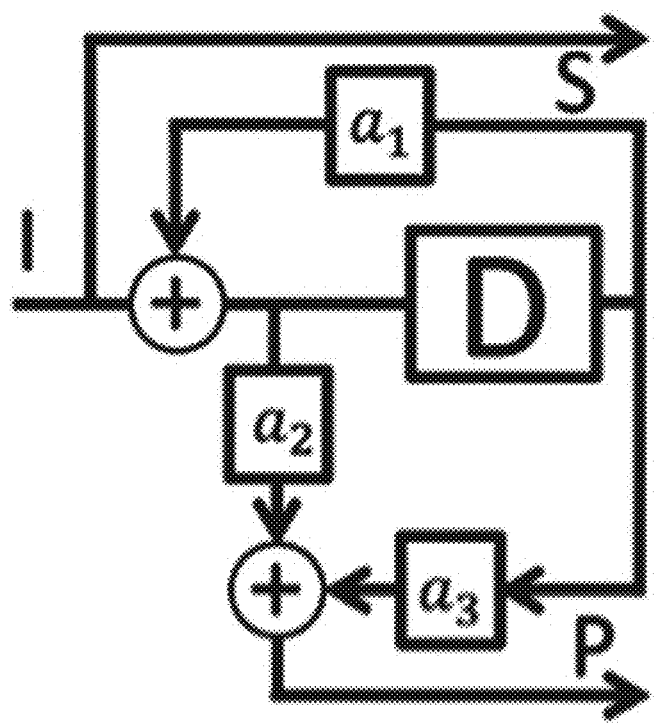
Figure 3B:
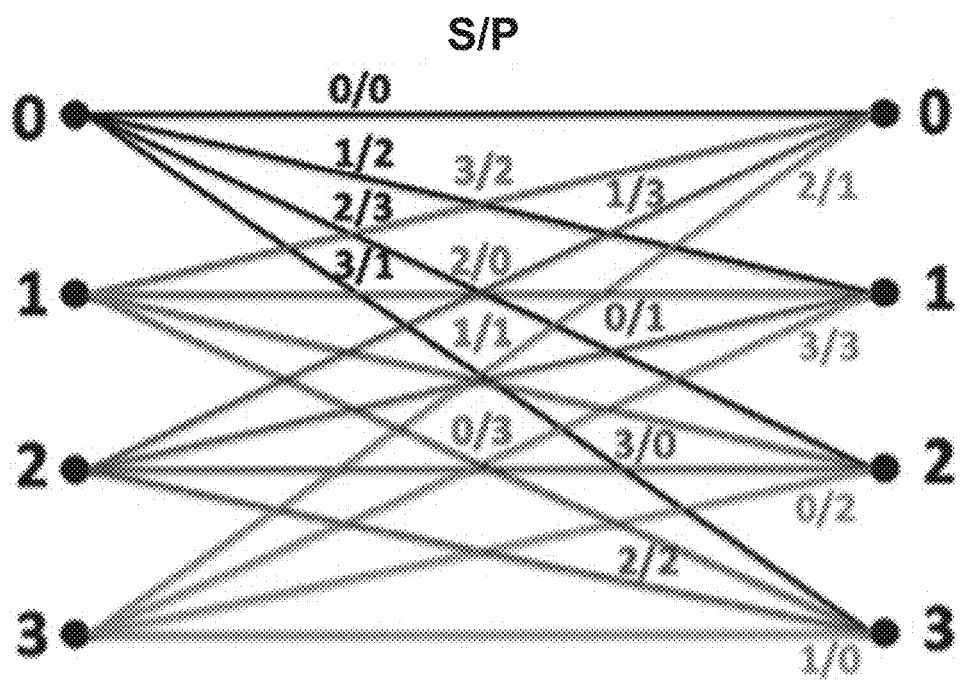

FIGS. 3A and 3B respectively illustrate the generic structure of a convolutional coder with a memory element on GF(q), and an example of a trellis of such a code.

Figure 4:
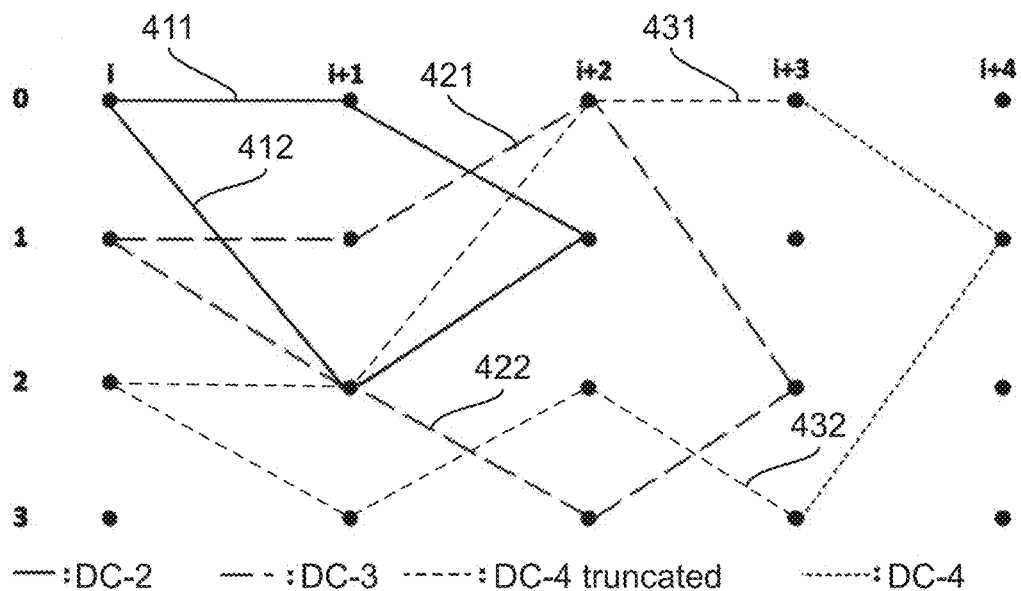

FIG. 4 shows some DC sequences of a code trellis.

Figure 5:
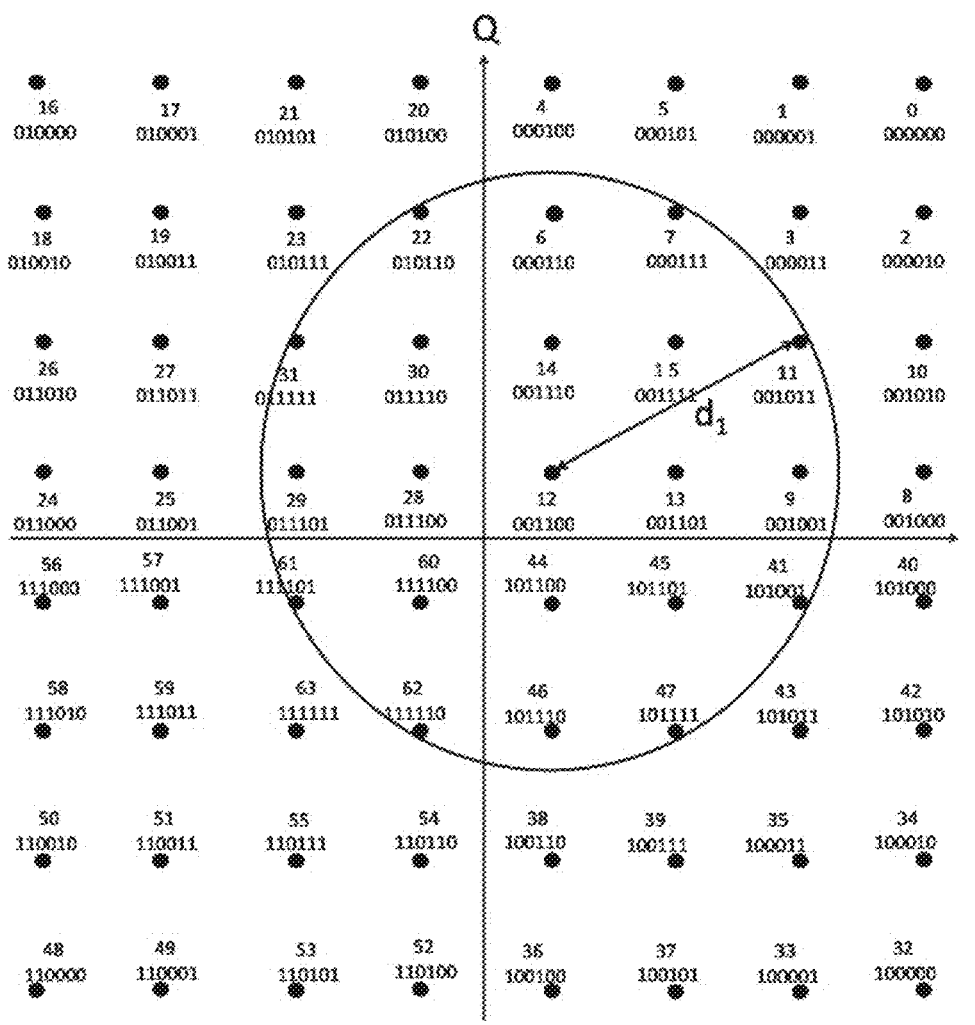

FIG. 5 illustrates a constellation associated with a 64-state amplitude modulation.

Figure 6:
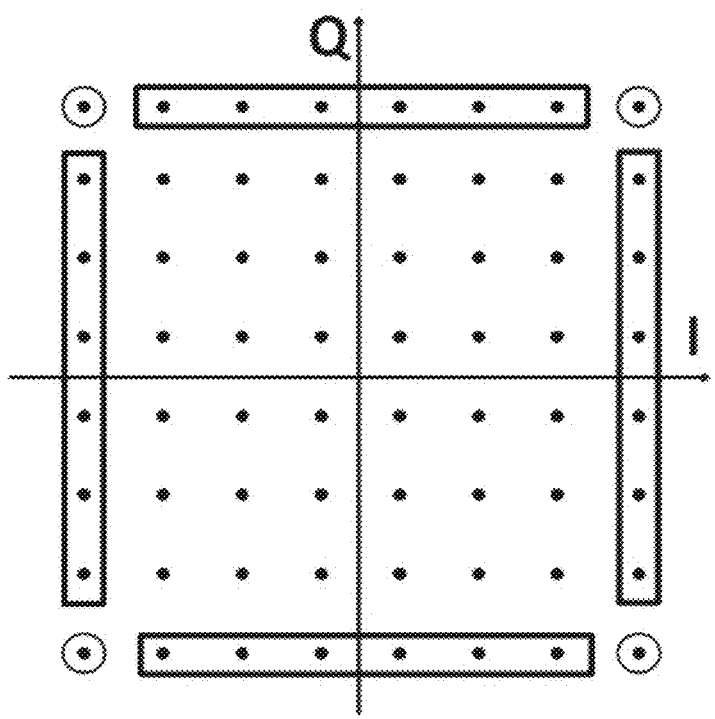

FIG. 6 illustrates the points in the constellation of FIG. 5 that experience the least interference.

Figure 7A:
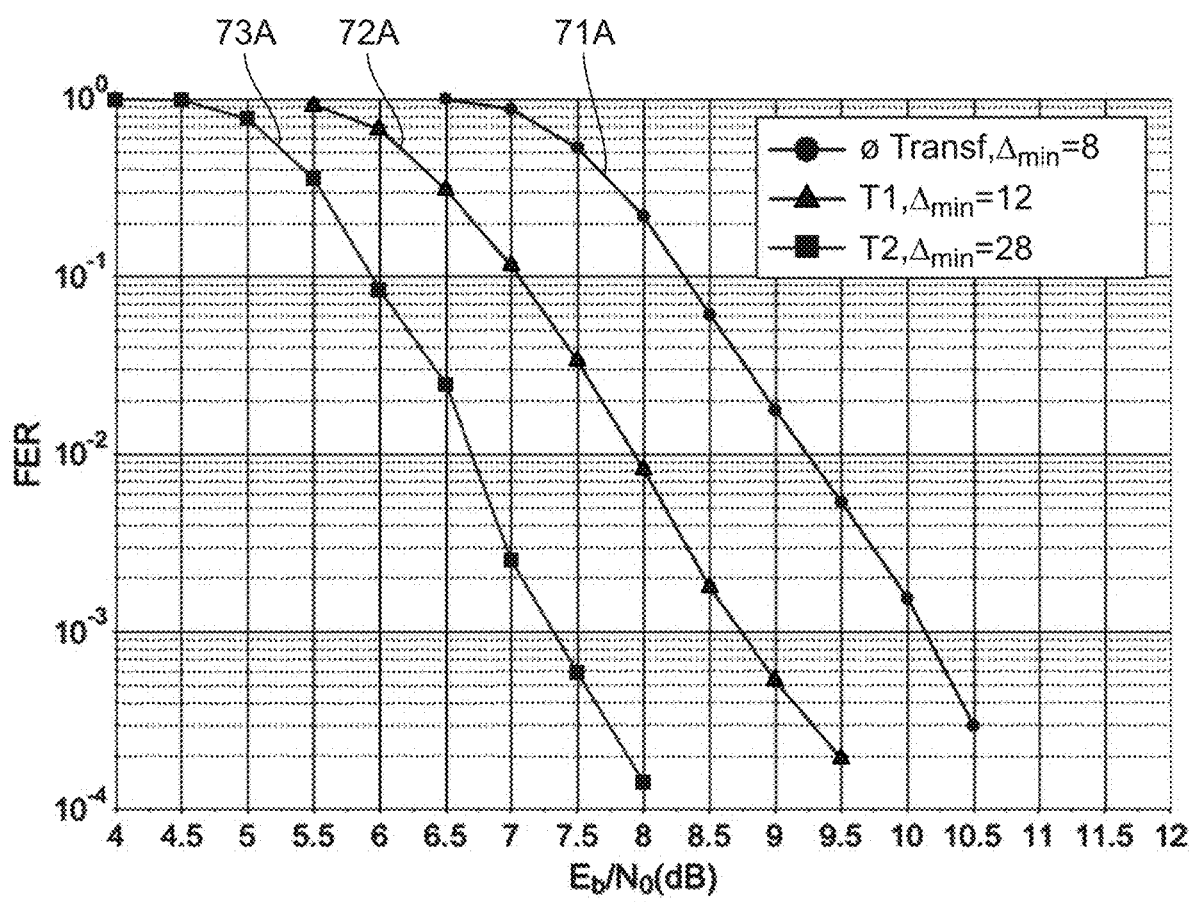
Figure 7B:
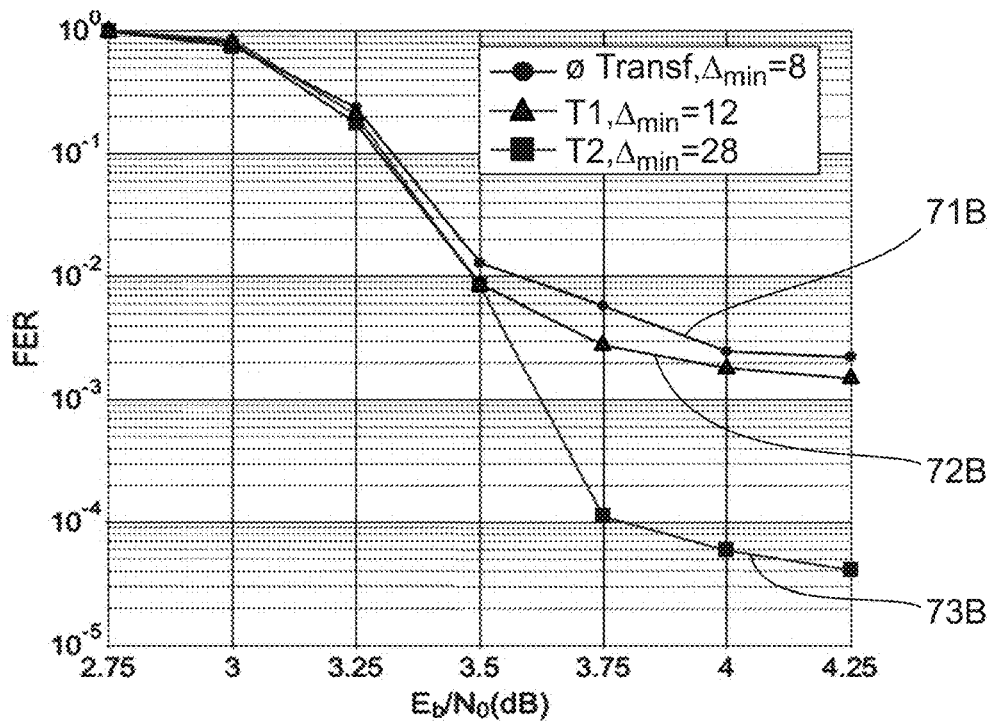
Figure 7C:
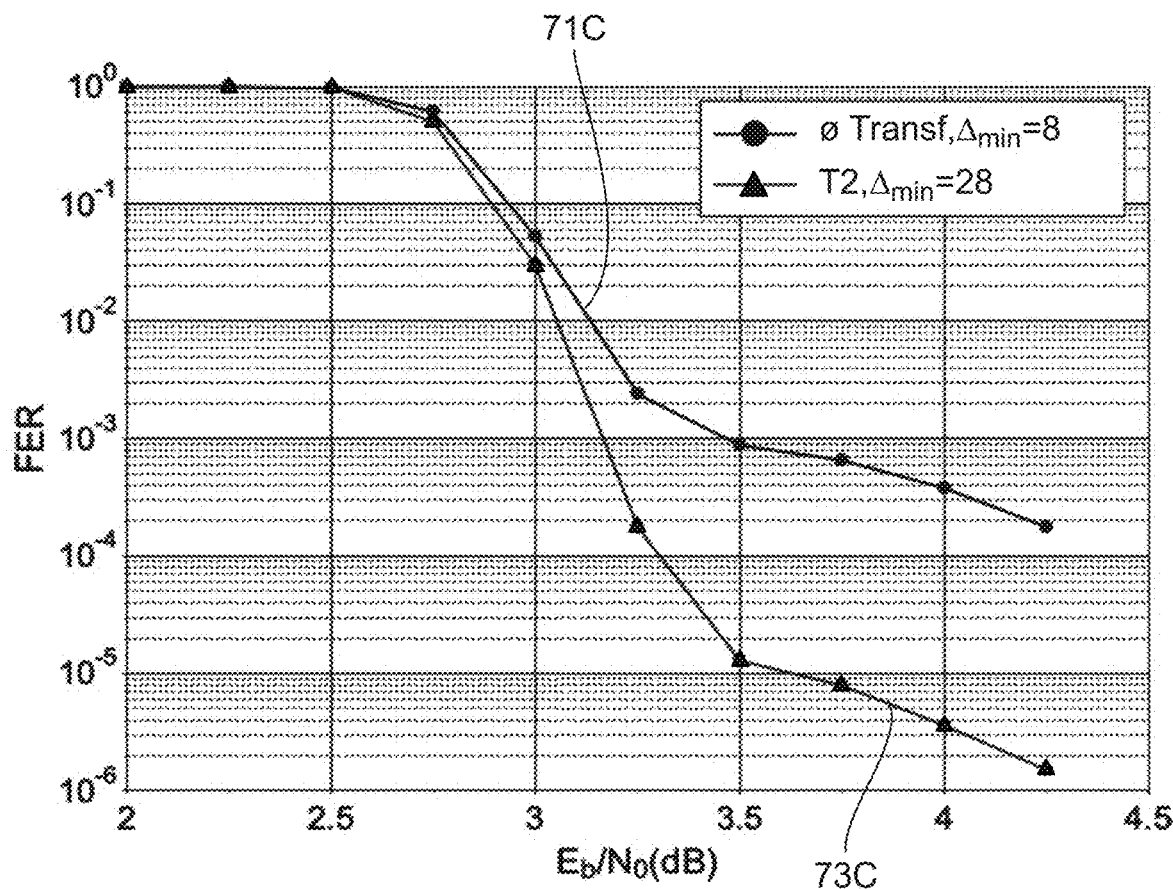

FIGS. 7A to 7C compare the correction performances of a turbo-code according to one embodiment of the invention with a turbo-code according to the prior art, when the order of the modulation and of the turbo-code are the same.

Figure 8:
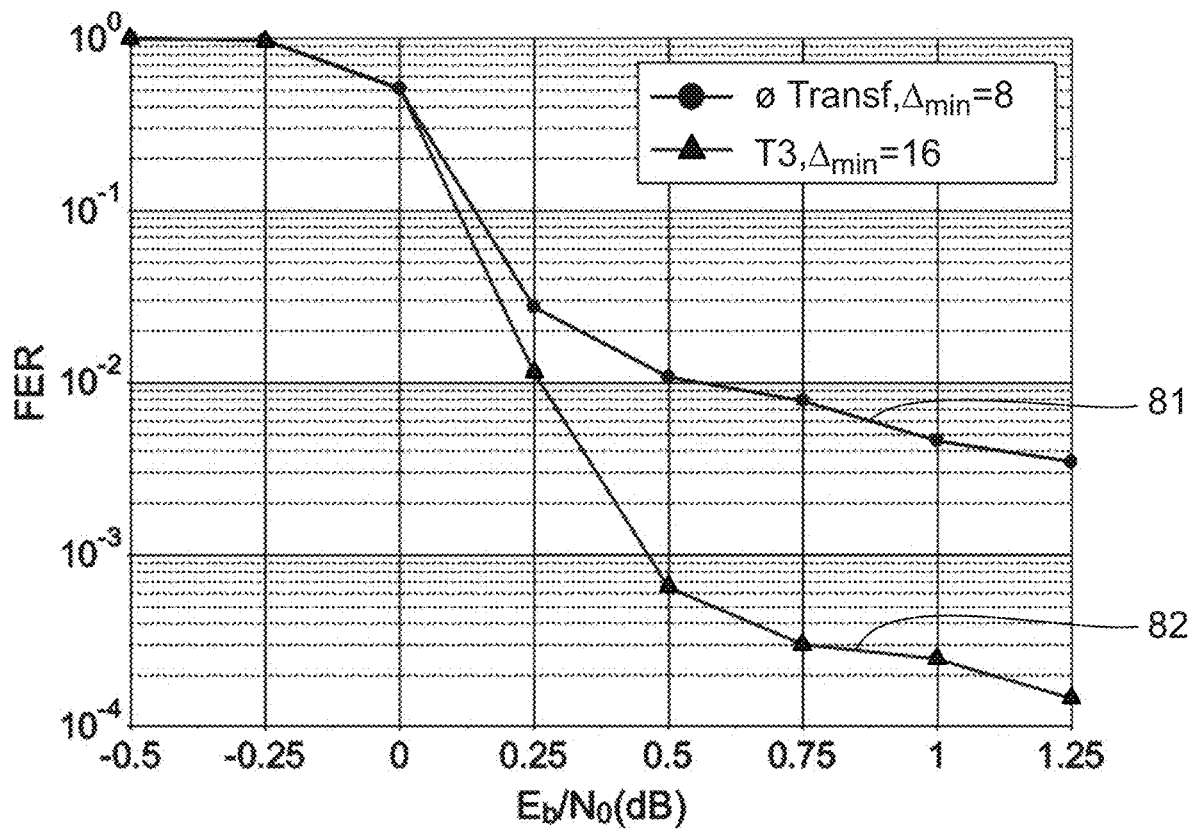

FIG. 8 compares the correction performances of a turbo-code according to one embodiment of the invention with a turbo-code according to the prior art, when the order of the modulation and of the turbo-code are different.

Figure 9:
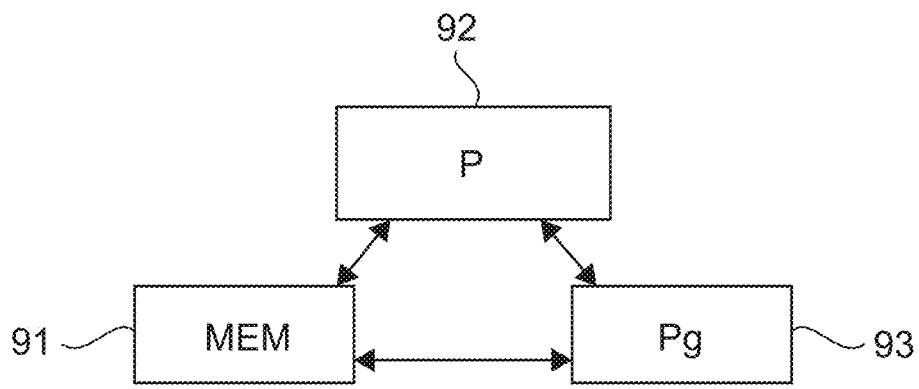

FIG. 9 shows the simplified structure of a device implementing a technique for generating a signal according to one embodiment of the invention.

5. DESCRIPTION OF AN EMBODIMENT OF THE INVENTION

5.1 General Principle

The general principle of the invention is based on the addition of a function for transforming information symbols in a turbo-coder, in particular a "non-binary" turbo-coder, allowing to modify the value of at least two information symbols, so that the sequence input on one encoder of the turbo-coder is different from the sequence input on the other encoder.

Figure 1:
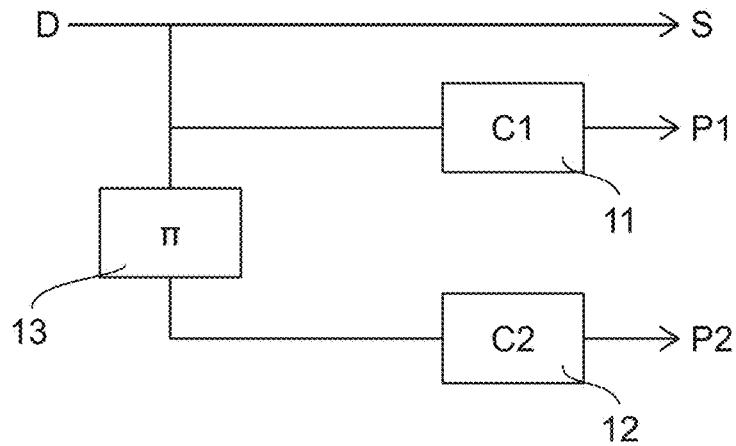
FIG. 1 illustrates a structure of a turbo-coder according to the prior art.
Figure 2A:
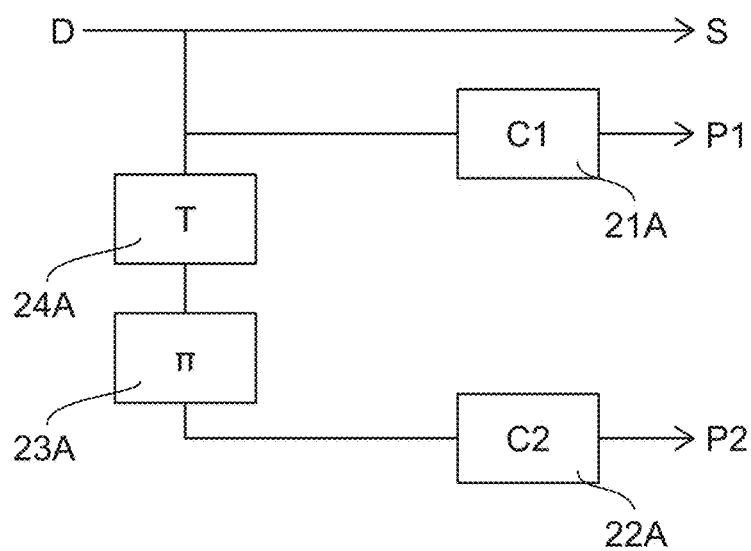
FIGS. 2A and 2B illustrate two examples of a turbo-coder according to various embodiments of the invention.
Figure 2B:
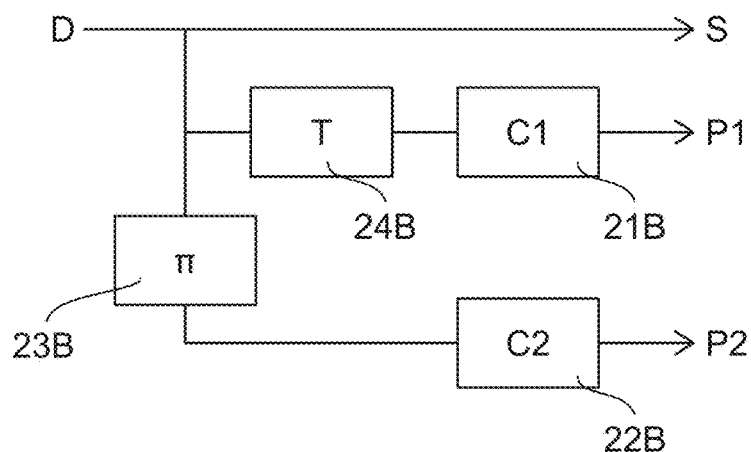

Two examples of structures of a turbo-coder implementing the turbo-coding step according to the invention are illustrated in FIGS. 2A and 2B. These two examples implement a first encoder C1 21 and a second encoder C2 22 in parallel, for example of the recursive systematic convolutional type, separated by an interleaver 23 and a transformation module 24. The digital input message D comprises K information symbols, and the digital output message comprises systematic symbols S and parity or redundancy symbols P1 and P2. Each sequence composed of the K information symbols and the P1 and P2 redundancy symbols forms a code word.

The systematic symbols S correspond to the K information symbols, possibly after interleaving and/or transformation.

According to the example illustrated in FIG. 2A, the digital input message D is encoded by the first encoder C1 21A, in the order of arrival of the information symbols. The input digital message D is, in parallel, transformed in the transformation module 24A, and the transformed information symbols are interleaved by the interleaver 23A. The interleaved transformed information symbols are then encoded by the second encoder C2 22A.

According to the example illustrated in FIG. 2B, the digital input message D is transformed in the transformation module 24B, and the transformed information symbols are encoded by the first encoder C1 21B, in the natural order. The input digital message D is, in parallel, interleaved by the interleaver 23B, and then the interleaved information symbols are encoded by the second encoder C2 22B.

Note that according to another example, not illustrated, the transformation can be implemented after the interleaving. The transformation can therefore be implemented either before or after the interleaving.

According to yet another example, not illustrated, a first transformation can be implemented before the first encoder, before the interleaver, and a second transformation, different from the first transformation and not cancelling the first transformation, can be implemented before the second encoder, before or after the interleaver. In this case, it is considered that the transformation function has two components, a first component corresponding to the first transformation and a second component corresponding to the second transformation. The "overall" transformation is therefore composed of a combination of the first and second transformations.

The term "transformation" is used below to cover these various implementations.

The turbo-coding step according to the invention therefore implements a bijective transformation of the information symbols, implemented before and/or after the interleaving, said transformation modifying the value of at least two of the information symbols prior to the encoding of the information symbols by the first and/or the second encoder.

In this way, the sequence of information symbols entering on the first encoder C1 differs from the sequence of information symbols entering on the second encoder C2, on the one hand by the order of the information symbols entering on each encoder, thanks to the interleaving, on the other hand by the value of the information symbols entering on each encoder, thanks to the transformation.

As indicated previously, the considered transformation is a bijection on the set of symbols of the considered Galois field. For example, if the information symbols are considered to be able to take values ranging from 0 to 15, that is to say are defined on a Galois field of cardinal q=16, then each information symbol of GF(16) has a unique image in GF(16) by the transformation T, and every element of GF(16) has a unique antecedent in GF(16). The table below gives an example of the bijective transformation of information symbols $S_i$, defined in GF(16), into information symbols $T(S_j)$, defined in GF(16):

TABLE 1

| $S_i$ | $T(S_i)$ |
|---|---|
| 0 | 9 |
| 1 | 5 |
| 2 | 7 |
| 3 | 4 |
| 4 | 12 |
| 5 | 11 |
| 6 | 15 |
| 7 | 1 |
| 8 | 13 |
| 9 | 3 |
| 10 | 14 |
| 11 | 10 |
| 12 | 2 |
| 13 | 0 |
| 14 | 8 |
| 15 | 6 |

In particular, if information symbols belonging to a Galois field of cardinal q with q>2, denoted GF(q), are considered, the proposed turbo-coding step allows to increase the distance between the information symbols, and, consequently, the minimum distance between the code words output by the turbo-coder.

According to a particular embodiment, the overall objective of the transformation is to increase the minimum cumulative Euclidean distance between two sequences of the resulting code relative to the code without transformation, independently of the nature of the elementary codes implemented by the first and second encoders and interleaver used.

Note that the minimum cumulative Euclidean distance between two code words output by the turbo-coder depends in particular on the constellation of the modulation used to transmit the code words.

Thus, according to one embodiment, the generation method according to the invention comprises a step of mapping information and redundancy symbols onto modulation symbols associated with a constellation of order p.

The transformation can thus be selected taking into account the constellation, and in particular the position of the modulation symbols associated with the information symbols before and after transformation.

5.2 Identification of "Problematic" Information Symbols

Conventionally, non-binary turbo-coders use recursive systematic convolutional encoders implementing elementary codes with a single memory element (v=1). Indeed, the complexity of decoding a code on GF(q) varies in $q^v$, where v is the memory of the code, and it is therefore easier to decode a code having only one memory element.

These convolutional encoders have the particularity of having fully connected trellises, that is to say that all the states are connected to each other in the code trellis.

For example, FIG. 3A illustrates the generic structure of a convolutional coder with a memory element on GF(q), with $a_1$, $a_2$, $a_3$ code setting parameters, D one memory element, I the input information symbols, S the output systematic symbols and P the output parity symbols. FIG. 3B illustrates an example of a trellis for a code defined on GF(4), with particular values for the adjustment parameters $a_1$, $a_2$, $a_3$, and with states 0 to 3.

The minimum cumulative Euclidean distance from a convolutional coder with one memory element, as illustrated in FIG. 3A or 3B for example, as well as the distances just above, are caused by particular sequences in the trellis which start from a given state and converge in another state, in particular the shorter sequences. These sequences are called "DC" (for "Diverge and Converge"). Some examples of DC sequences are illustrated in FIG. 4 for a code defined on GF(4): an example of a DC sequence of length 2, an example of a DC sequence of length 3 and an example of a DC sequence of length 4.

For a pair of DC sequences, $X^1$ and $X^2$, spanning L trellis sections (for example sequences 411 and 412 spanning two trellis sections, the sequences 421 and 422 spanning three trellis sequences, or the sequences 431 and 432 spanning four trellis sections), the cumulative Euclidean distance between the modulation symbols associated with these sequences is calculated as follows:

$$d_{euc} = \sqrt{\sum_{l=1}^{L}[d^2(X_{ls}^{m1}, X_{ls}^{m2}) + d^2(X_{lp}^{m1}, X_{lp}^{m2})]} \quad \text{[Equation 2]}$$

$$d_{euc} = \sqrt{\sum_{l=1}^{L}\left[\left(I_{X_{ls}^{m1}} - I_{X_{ls}^{m2}}\right)^2 + \left(Q_{X_{ls}^{m1}} - Q_{X_{ls}^{m2}}\right)^2 + \sqrt{\left(I_{X_{lp}^{m1}} - I_{X_{lp}^{m2}}\right)^2 + \left(Q_{X_{lp}^{m1}} - Q_{X_{lp}^{m2}}\right)^2}\right]} \quad \text{[Equation 3]}$$

where:

$X_{ls}^{mb}$ and $X_{lp}^{mb}$ are respectively the modulation symbols onto which are mapped the systematic and parity symbols corresponding to the trellis section I in the sequence $X^b$, b=1, 2 and $I_x$ and $Q_x$ represent the in-phase and quadrature components of the signal x in the considered constellation.

Due to the total connection property of the trellis, the pairs of systematic symbols S carried by the different sections of the DC sequences $X^1$ and $X^2$ can take all the combinations in GF(q)×GF(q). More specifically, the systematic symbols carried by the first and last trellis sections of the sequences DC are necessarily different on the two sequences. This is not the case for the symbols carried by the intermediate trellis sections when L>2, for which the systematic symbols may be identical.

The inventors of the present patent application have demonstrated that for this family of codes with v=1 memory element, the DC sequences that are associated with modulation symbols whose cumulative Euclidean distance relative to the transmitted sequence is small, are essentially generated by modulation symbols located in the vicinity of modulation symbols actually transmitted, that is to say for which the following terms in equation 3 are of low value:

$$(I_{x_{ls}^{m1}} - I_{x_{ls}^{m2}})^2 + (Q_{x_{ls}^{m1}} - Q_{x_{ls}^{m2}})^2.$$

For example, if a recursive coder as illustrated in FIG. 3A, defined on GF(64), is considered, the inventors of the present patent application have demonstrated that regardless of the values of the coefficients $a_i$, the two terms of the lowest cumulative Euclidean distances of the UB are obtained for pairs of sequences wherein the modulation symbols associated with systematic symbols are spaced two by two by at most the distance $d_1$ indicated in FIG. 5 for a 64-QAM constellation. In other words, for a systematic symbol transmitted on a given modulation symbol, for example the modulation symbol 12 (whose binary representation is 001100) in the constellation, the most probable concurrent systematic symbols are those located in the circle of radius $d_1$ centred on the modulation symbol 12 in the constellation.

5.3 Examples of Implementation

In order to move the information symbols transmitted away from the most probable concurrent information symbols, and therefore to increase the minimum Euclidean distance between two code words at the output of the turbo-coder, it is proposed according to the invention to introduce a transformation before one of the encoding steps implemented by the turbo-encoder.

In particular, the transformation maximises the cumulative gap between the modulation symbols associated with the information symbols before transformation and after transformation. As a result, maximising the cumulative gap between the modulation symbols associated with the information symbols before transformation and after transformation allows to increase the minimum Euclidean distance between two code words at the output of the turbo-coder.

The cumulative gap between two information symbols, or more specifically between two modulation symbols associated with two information symbols, can in particular be expressed in terms of squared Euclidean distance. Of course, other types of distance can be used to measure the gap, or distance, between information symbols.

In other words, if the dispersion $\Delta(S_i, S_j)$ between two information symbols $S_i$ and $S_j$ of GF(q) is defined as the cumulative distance between two information symbols before and after transformation by the function T:

$$\Delta(S_i,S_j)=D(S_i,S_j)+D(T(S_i),T(S_j)) \qquad \text{[Equation 4]}$$

the transformation is selected so as to maximise the minimum value of the dispersion $\Delta(S_i, S_j)$, denoted $\Delta_{min}$, or at the very least to obtain a minimum value of the dispersion $\Delta(S_i, S_j)$ greater than a selection threshold:

$$\Delta_{min} = \min_{(S_i,S_j)\in GF(q)^2} \Delta(S_i, S_j) \qquad \text{[Equation 5]}$$

In particular, the dispersion $\Delta(S_i, S_j)$ between two information symbols $S_i$ and $S_j$ of GF(q) is expressed as the sum of the square of the Euclidean distance between the modulation symbols $S_i^m$, $S_j^m$ on which the information symbols $S_i$, $S_j$ are mapped before transformation and the square of the Euclidean distance between the modulation symbols $T(S_i)^m$, $T(S_j)^m$ onto which the information symbols $S_i$, $S_j$ are mapped after transformation by the function T.

$$\Delta(S_i,S_j)=d_{euc}^2(S_i^m,S_j^m)+d_{euc}^2(T(S_i)^m,T(S_j)^m) \qquad \text{[Equation 6]}$$

The expression of the dispersion given by equation 6 gives integer values in the case of q-QAM constellations. However, any other expression of the dispersion whose maximisation or minimisation amounts to maximising the cumulative gap between the information symbols before and after transformation can be used.

The purpose of the transformation function is thus to ensure a high value of $\Delta_{min}$, that is to say greater than a selection threshold Th, in order to guarantee that if two information symbols are close (for example mapped on neighbouring modulation symbols in the constellation) before transformation, they are distant after transformation, and vice versa.

As it can be tedious to enumerate all the transformations in order to select the one which has the maximum value of $\Delta_{min}$, in particular for high values of q (cardinality of the Galois field), it is proposed according to the invention to select sufficiently large values of $\Delta_{min}$, and for example greater than the selection threshold Th.

Various examples of transformation are presented below allowing to obtain sufficiently high minimum dispersion values $\Delta_{min}$, depending on whether the cardinal of the Galois field on which the code is defined, q, and the order of the modulation, p, are identical or different.

A) Code and Modulation of the Same Order: q=p

When the order p of the modulation, represented by a constellation, is equal to the cardinal q of the Galois field to which the information symbols belong, each information or redundancy symbol is mapped to a unique modulation symbol. In other words, if a transmission chain comprising a turbo-encoding step according to the invention is considered, taking as input information symbols defined on a Galois field GF(q) and delivering the information symbols and redundancy symbols defined on the Galois field GF(q), and a q-QAM type amplitude modulation step, each information or redundancy symbol resulting from the turbo-coding step is transmitted on a modulation symbol of the q-QAM modulation, each modulation symbol being defined on the alphabet q (q-ary symbol).

In this case, the dispersion $\Delta(S_i, S_j)$ between two information symbols $S_i$ and $S_j$ of GF(q) is expressed as:

$$\Delta(S_i,S_j)=d_{euc}^2(S_i^m,S_j^m)+d_{euc}^2(T(S_i)^m,T(S_j)^m)$$

with:
- $d_{euc}^2(S_i^m,S_j^m)=(I_{S_i^m}-I_{S_j^m})^2+(Q_{S_i^m}-Q_{S_j^m})^2$ the square of the Euclidean distance between the modulation symbols $S_i^m$, $S_j^m$ onto which said information symbols $S_i$, $S_j$ are mapped before transformation;
- $d_{euc}^2(T(S_i)^m,T(S_j)^m)=(I_{T(S_i)^m}-I_{T(S_j)^m})^2+(Q_{T(S_i)^m}-Q_{T(S_j)^m})^2$ the square of the Euclidean distance between the modulation symbols $T(S_i)^m$, $T(S_j)^m$ onto which said information symbols $S_i$, $S_j$ are mapped after transformation; and $I_x$ and $Q_x$ are the in-phase and quadrature components of a signal x in the considered constellation.

According to a first example of implementation, the transformation transforms a pair of information symbols intended to be mapped onto a pair of modulation symbols whose Euclidean distance is less than a first threshold, into a pair of information symbols intended to be mapped onto a pair of modulation symbols whose Euclidean distance is greater than the first threshold.

In other words, if the pair of information symbols $(S_i, S_j)$ before transformation is mapped onto a pair of modulation symbols having a small Euclidean distance, the pair of information symbols $(T(S_i), T(S_j))$ after transformation must be mapped onto a modulation symbol pair having a large Euclidean distance, and vice versa, so as to maximise the minimum dispersion between the information symbols $S_i$, $S_j$.

An example of the construction of the transformation function is presented below which allows, according to a first criterion, to guarantee a minimum value for the dispersion between the information symbols $S_i$, $S_j$.

According to this example, in order to guarantee a minimum dispersion for each pair of information symbols $(S_i, S_j)$, it is necessary to know the distribution of the Euclidean distances between the set of pairs of modulation symbols associated with the set of pairs of information symbols in the considered constellation. For a 64-QAM constellation as illustrated in FIG. 5 for example, 33 different values of distances between two different modulation symbols can be listed.

The table below provides the list of multiplicities $m(D_i)$ associated with each distance $D_i$, that is to say the number of pairs of modulation symbols at each distance $D_i$, the distances being classified in increasing order. $D_1$ corresponds to the distance between two direct neighbours and $D_{33}$ to the distance between two opposite corners of the constellation:

TABLE 2

| $D_i$ | $m(D_i)$ | $D_i$ | $m(D_i)$ | $D_i$ | $m(D_i)$ |
|---|---|---|---|---|---|
| $D_1$ | 112 | $D_{12}$ | 96 | $D_{23}$ | 16 |
| $D_2$ | 98 | $D_{13}$ | 128 | $D_{24}$ | 46 |
| $D_3$ | 96 | $D_{14}$ | 84 | $D_{25}$ | 32 |
| $D_4$ | 168 | $D_{15}$ | 72 | $D_{26}$ | 24 |
| $D_5$ | 72 | $D_{16}$ | 32 | $D_{27}$ | 20 |
| $D_6$ | 80 | $D_{17}$ | 60 | $D_{28}$ | 24 |
| $D_7$ | 140 | $D_{18}$ | 32 | $D_{29}$ | 16 |
| $D_8$ | 120 | $D_{19}$ | 56 | $D_{30}$ | 8 |
| $D_9$ | 64 | $D_{20}$ | 48 | $D_{31}$ | 12 |
| $D_{10}$ | 112 | $D_{21}$ | 48 | $D_{32}$ | 8 |
| $D_{11}$ | 50 | $D_{22}$ | 40 | $D_{33}$ | 2 |

A first rule for constructing the transformation function consists in associating the pairs whose distances before transformation are at the start of the table with pairs whose distances after transformation are at the end of the table.

For example, a maximum value of i, denoted $i_{max}$, is sought such that if the Euclidean distance before transformation between all the pairs of modulation symbols associated with the information symbols S and S', denoted $d_{euc}(S^m, S'^m)$, is less than or equal to $Di_{max}$, their distance after transformation, denoted $d_{euc}(T(S)^m, T(S')^m)$, is strictly greater than $Di_{max}$. Then, this guarantees $\Delta_{min} \geq D_{i_{max}+1} + D_1$.

For example, for a 64-QAM modulation as shown in FIG. 5, $i_{max}$ is equal to 3: $Di_{max} = D_3$.

Table 3 below provides the list in multiplicities associated with Euclidean distances after transformation for pairs of information symbols S and S' whose Euclidean distance before transformation is less than $Di_{max}: d_{euc}(S^m, S'^{nm}) \leq Di_{max}$.

It can be seen that all the pairs of modulation symbols associated with information symbols have a Euclidean distance strictly greater than $Di_{max} = D_3$, since the first three multiplicity values are equal to 0.

TABLE 3

| $D_i$ | $m(D_i)$ | $D_i$ | $m(D_i)$ | $D_i$ | $m(D_i)$ |
|---|---|---|---|---|---|
| $D_1$ | 0 | $D_{12}$ | 15 | $D_{23}$ | 5 |
| $D_2$ | 0 | $D_{13}$ | 29 | $D_{24}$ | 12 |
| $D_3$ | 0 | $D_{14}$ | 6 | $D_{25}$ | 7 |
| $D_4$ | 25 | $D_{15}$ | 7 | $D_{26}$ | 3 |
| $D_5$ | 16 | $D_{16}$ | 5 | $D_{27}$ | 8 |
| $D_6$ | 21 | $D_{17}$ | 12 | $D_{28}$ | 4 |
| $D_7$ | 27 | $D_{18}$ | 3 | $D_{29}$ | 6 |
| $D_8$ | 19 | $D_{19}$ | 8 | $D_{30}$ | 2 |
| $D_9$ | 10 | $D_{20}$ | 5 | $D_{31}$ | 1 |
| $D_{10}$ | 22 | $D_{21}$ | 3 | $D_{32}$ | 2 |
| $D_{11}$ | 13 | $D_{22}$ | 9 | $D_{33}$ | 1 |

According to a second example of implementation, the transformation transforms an information symbol intended to be mapped onto a modulation symbol having, in the constellation, a number of neighbouring modulation symbols less than a determined number, into an information symbol intended to be mapped onto a modulation symbol having, in the constellation, a number of neighbouring modulation symbols greater than said determined number, and vice versa, as long as this is possible.

An example of the construction of the transformation function is presented below, allowing, according to a second criterion, to optimise the level of protection of information symbols.

Considering, as an example, the case of the 64-QAM constellation illustrated in FIG. 6, it is seen that the 28 modulation symbols represented by the constellation points located at the corners (circled points) and on the edges (boxed points) of the constellation have fewer direct neighbours than the modulation symbols located at the centre of the constellation. The constellation therefore gives the information or redundancy symbols mapped to these modulation symbols located at the corners and on the edges better protection, because the number of modulation symbols with which these modulation symbols located at the corners and on the edges can coincide is lower.

Consequently, if the transformation is constructed such that the information symbols mapped onto modulation symbols located on the edges and corners of the constellation before (respectively after) transformation end up in the central part of the constellation after (respectively before) transformation, the total number of information symbols benefiting from this increased protection will be doubled compared to a coding pattern without transformation.

In other words, in the case where the information and redundancy symbols from the turbo-coder are associated with a constellation having different levels of symbol protection, a second rule of construction of the transformation can thus be defined.

Note that these two examples of implementation of the transformation can be applied independently (that is to say individually) or in combination.

For example, two transformation functions, denoted T1 and T2, are presented, said functions are obtained by applying the two preceding construction rules, and according to which the information and redundancy symbols belong to the Galois field GF(64) and are intended to be mapped onto modulation symbols of a 64-QAM quadrature amplitude modulation as shown in FIG. 5.

The mapping of symbols of GF(64) onto the 64-QAM constellation is given by the following table, where $b_5b_4b_3b_2b_1b_0$ is the binary representation of each symbol in GF(64), $b_5$ representing the most significant bit (MSB) and $b_0$ the least significant bit (LSB).

TABLE 4

| Value of Q | $b_5b_3b_1$ | Value of I | $b_4b_2b_0$ |
|---|---|---|---|
| +7 | 000 | +7 | 000 |
| +5 | 001 | +5 | 001 |
| +3 | 011 | +3 | 011 |
| +1 | 010 | +1 | 010 |
| −1 | 110 | −1 | 110 |
| −3 | 111 | −3 | 111 |
| −5 | 101 | −5 | 101 |
| −7 | 100 | −7 | 100 |

The transformation T1 corresponds to a minimum dispersion value $\Delta_{min}=12$, and the transformation T2 corresponds to the largest minimum dispersion value found for a 64-QAM constellation, $\Delta_{min}=28$:

TABLE 5

| x | T1(x) | T2(x) | x | T1(x) | T2(x) | x | T1(x) | T2(x) | x | T1(x) | T2(x) |
|---|---|---|---|---|---|---|---|---|---|---|---|
| 0 | 0 | 15 | 16 | 48 | 7 | 32 | 13 | 11 | 48 | 61 | 41 |
| 1 | 3 | 19 | 17 | 51 | 25 | 33 | 14 | 47 | 49 | 62 | 62 |
| 2 | 6 | 29 | 18 | 54 | 39 | 34 | 11 | 28 | 50 | 59 | 31 |
| 3 | 5 | 0 | 19 | 53 | 9 | 35 | 8 | 50 | 51 | 56 | 33 |
| 4 | 12 | 3 | 20 | 60 | 51 | 36 | 1 | 63 | 52 | 49 | 45 |
| 5 | 15 | 35 | 21 | 63 | 46 | 37 | 2 | 27 | 53 | 50 | 22 |
| 6 | 10 | 12 | 22 | 58 | 37 | 38 | 7 | 10 | 54 | 55 | 49 |
| 7 | 9 | 4 | 23 | 57 | 17 | 39 | 4 | 5 | 55 | 52 | 18 |
| 8 | 24 | 6 | 24 | 40 | 14 | 40 | 21 | 57 | 56 | 37 | 43 |
| 9 | 27 | 8 | 25 | 43 | 2 | 41 | 22 | 44 | 57 | 38 | 60 |
| 10 | 30 | 38 | 26 | 46 | 59 | 42 | 19 | 54 | 58 | 35 | 55 |
| 11 | 29 | 32 | 27 | 45 | 52 | 43 | 16 | 21 | 59 | 32 | 56 |
| 12 | 20 | 1 | 28 | 36 | 34 | 44 | 25 | 58 | 60 | 41 | 13 |
| 13 | 23 | 16 | 29 | 39 | 26 | 45 | 26 | 53 | 61 | 42 | 20 |
| 14 | 18 | 23 | 30 | 34 | 61 | 46 | 31 | 30 | 62 | 47 | 36 |
| 15 | 17 | 24 | 31 | 33 | 48 | 47 | 28 | 42 | 63 | 44 | 40 |

According to a third example of implementation, the method for generating a signal implements a step of selecting the transformation from several available transformations, the selection taking into account the redundancy symbols and/or the interleaver.

In particular, in the case where the first and/or second rules allow to construct several equivalent transformation functions according to the corresponding criteria, a third criterion can be applied, to select one of the transformations.

For this purpose, for each sequence X comprising two or three systematic symbols on GF(q), the concurrent sequences X' comprising the most probable concurrent systematic symbols are identified, as defined previously and illustrated in FIG. 5 for GF(64). Indeed, as demonstrated previously, it is the DC sequences of length 2 or 3 which are at the origin of the minimum Euclidean distance of the coded modulation, which limits the performances at low error rates.

The cumulative Euclidean distance of the modulation symbols associated with the redundancy symbols between each transmitted sequence and the concurrent sequences is then determined, before and after transformation:

$$d_{euc,p}^2 = \sum_{l=1}^{L}[d^2(X_{lp}^m, X_{lp}^{m'}) + d^2(Y_{lp}^m, Y_{lp}^{m'})] \quad \text{[Equation 7]}$$

where:

L is the number of modulation symbols associated with systematic symbols (that is to say L=2 or L=3);

$X_{lp}^m, X_{lp}^{m'}$ represent respectively the modulation symbols associated with the I-th parity symbols of the sequences X and X' obtained from the information symbols;

$Y_{lp}^m, Y_{lp}^{m'}$ represent respectively the modulation symbols associated with the I-th parity symbols of the sequences T(X) and T(X') obtained from the transformed information symbols;

The selection step selects for example the transformation T which leads to the best distance spectrum, where the distance spectrum is composed of all the calculated distance values sorted in ascending order associated with the number of occurrences (multiplicity) for each distance. The best distance spectrum is the one that gives the greatest minimum distance. If the minimum distances are equal, for example, the spectrum with a lower number of occurrences of the minimum distance is selected. If the multiplicity is equal, the distance value just above the minimum distance can be checked.

According to this third example of implementation, the most advantageous transformation in terms of cumulative Euclidean distance is thus selected.

It is noted that if the transformation function has two components, one implemented before the first encoding and the other before the second encoding, before or after interleaving, the above criteria apply so as to optimise the overall transformation function.

B) Code and Modulation of Different Order: q>p

When the modulation order p, represented by a constellation, is less than the cardinal q of the Galois field to which the information symbols belong, each information or redundancy symbol is mapped onto several modulation symbols. In other words, if a transmission chain comprising a turbo-encoding step according to the invention is considered, taking as input information symbols defined on a Galois field GF(q), and delivering the information symbols and redundancy symbols defined on the Galois field GF(q), and a modulation step of order p, each information or redundancy symbol resulting from the turbo-coding step is transmitted on n modulation symbols, each modulation symbol being defined on the alphabet p (p-ary symbol).

The introduction of a transformation function thus allows to improve the performances of correction at a low error rate when the symbols of the Galois field on which the code, q, is defined, are transmitted using n symbols of a constellation with a lower order p: $q=p^n$.

For example, each information or redundancy symbol derived from the turbo-coder, defined on GF(256), is transmitted on two modulation symbols of a 16-QAM modulation (q=256, p=16, n=2), defined in the alphabet 0 to 15, where each information or redundancy symbol from the turbo-coder, defined on GF(64), is transmitted on three QPSK modulation symbols (q=64, p=4, n=3), defined in the alphabet 0 to 3.

In this case, each information or redundancy symbol of GF(q) can be represented by a set of n modulation symbols associated with a constellation of order p (for example p-QAM).

In this case, the dispersion $\Delta(S_i, S_j)$ between two information symbols $S_i$ and $S_j$ of GF(q) is expressed as:

$$\Delta(S_i, S_j) = D(S_i, S_j) + D(T(S_i), T(S_j)) =$$

$$\Delta(S_i, S_j) = \sum_{k=1}^{n} d_{euc}^2(S_{i,k}^m, S_{j,k}^m) + \sum_{k=1}^{n} d_{euc}^2(T(S_i)_k^m, T(S_j)_k^m) =$$

$$\sum_{k=1}^{n}\left[\left(I_{S_{i,k}^m} - I_{S_{j,k}^m}\right)^2 + \left(Q_{S_{i,k}^m} - Q_{S_{j,k}^m}\right)^2\right] +$$

$$\sum_{k=1}^{n}\left[\left(I_{T(S_i)_k^m} - I_{T(S_j)_k^m}\right)^2 + \left(Q_{T(S_i)_k^m} - Q_{T(S_j)_k^m}\right)^2\right]$$

[Equation 8]

with:

$S^m_{i,k}$ respectively $S^m_{j,k}$, for k ranging from 1 to n, the n modulation symbols associated with the information symbol $S_i$, respectively $S_j$, before transformation, $T(S_i)_k^m$, respectively $T(S_j)_k^m$, for k ranging from 1 to n, the n modulation symbols associated with the information symbol $S_i$, respectively $S_j$, after transformation, $I_x$ and $Q_x$ are the in-phase and quadrature components of a signal x in the considered constellation.

The distance term between two symbols of GF(q) therefore breaks down into n terms, each of the n terms representing a Euclidean distance in the space of the constellation of order p.

Various implementation examples are presented below to obtain a sufficiently high minimum dispersion value $\Delta_{min}$ that is to say greater than a selection threshold, in this particular case where q>p:

$$\Delta_{min} = \min_{(S_i S_j) \in GF(q)^2} \Delta(S_i, S_j).$$

According to a first example of implementation, the transformation minimises the number of zero terms in equation 8 of the dispersion $\Delta(S_i,S_j)$.

More specifically, each expression of the distance $D(S_i,S_j)$ contains n terms of Euclidean distance in the space of a constellation with p signals. consequently, it is sought to minimise the number of p-ary symbols, among the n modulation symbols associated with each information symbol of GF(q), which are identical before and after transformation.

For this purpose, the transformation associates pairs of information symbols of GF(q) having many p-ary symbols in common, with pairs of information symbols having few p-ary symbols in common, and vice versa.

In other words, the transformation transforms a pair of information symbols each intended to be mapped onto n p-ary modulation symbols, the number of p-ary symbols in common between the two sets of n p-ary modulation symbols being greater than a second threshold, into a pair of information symbols each intended to be mapped onto n p-ary modulation symbols, the number of p-ary symbols in common between these two sets of n p-ary modulation symbols being less than the second threshold, and vice versa.

For example, if a turbo-code defined on the Galois field GF(64) is considered, for which each information or redundancy symbol is transmitted on three QPSK modulation symbols (that is to say q=64, p=4, n=3), two distinct information symbols in GF(64) may differ by one, two or three distinct modulation symbols in the QPSK constellation.

Thus, if the information symbol 19 (010011) defined in GF(64) is intended to be mapped onto the three QPSK modulation symbols 103 and the information symbol 62 (111110) is intended to be mapped onto the three modulation QPSK symbols 332, the two information symbols 19 and 62 differ, in the QPSK constellation, by three modulation symbols (1≠3, 0≠3, 3≠2). The expression of the distance between the information symbols, D (19,62) contains no zero term.

If the information symbol 55 (110111) is intended to be mapped onto the three modulation symbols 313, and the information symbol 62 (111110) is intended to be mapped onto the three modulation symbols 332, the two information symbols differ, in the QPSK constellation, by two modulation symbols (3=3, 1≠3, 3≠2). The expression of the distance between the information symbols, D (55,62) therefore contains one zero term.

If the information symbol 63 (111111) is intended to be mapped onto the three modulation symbols 333, and the information symbol 62 (111110) is intended to be mapped onto the three modulation symbols 332, the two information symbols differ, in the QPSK constellation, by a single modulation symbol (3=3, 3=3, 3≠2). The expression of the distance between the information symbols, D (63,62) therefore contains two zero terms.

Among the $C_{64}^2$=2016 possible combinations of pairs of information symbols of GF(64), we determine as follows:

864 pairs having no QPSK symbol in common when the information symbols are represented in the QPSK constellation, 864 pairs having one QPSK symbol in common when the information symbols are represented in the QPSK constellation, 288 pairs having two QPSK symbols in common when the information symbols are represented in the QPSK constellation.

The proposed transformation allows to associate as a priority the pairs of information symbols having, in the QPSK constellation, two QPSK symbols in common with the pairs of information symbols having, in the QPSK constellation, no QPSK symbol in common, then the pairs of information symbols having, in the QPSK constellation, one QPSK symbol in common with the pairs of information symbols having, in the QPSK constellation, no QPSK symbol in common.

For example, the transformation T3 proposed below in Table 7 allows to transform the 288 pairs of information symbols having two QPSK symbols in common, before transformation, into 288 pairs having no QPSK symbol in common, after transformation, and to transform 48 pairs of information symbols having one QPSK symbol in common, before transformation, into 48 pairs having no QPSK symbol in common, after transformation. The remaining 864-48=816 pairs of information symbols keep one common QPSK symbol after transformation.

The mapping to the QPSK constellation is given by the following Table 6, where $b_1 b_0$ is the binary representation associated with each QPSK modulation symbol, $b_1$ representing the most significant bit (MSB) and $b_0$ the least significant bit (LSB).

TABLE 6

| Value of Q | $b_1$ | Value of I | $b_0$ |
|---|---|---|---|
| +1 | 0 | +1 | 0 |
| −1 | 1 | −1 | 1 |

TABLE 7

| x | T3(x) | x | T3(x) | x | T3(x) | x | T3(x) |
|---|---|---|---|---|---|---|---|
| 0 | 0 | 16 | 30 | 32 | 39 | 48 | 57 |
| 1 | 21 | 17 | 11 | 33 | 50 | 49 | 44 |
| 2 | 42 | 18 | 52 | 34 | 13 | 50 | 19 |
| 3 | 63 | 19 | 33 | 35 | 24 | 51 | 6 |
| 4 | 27 | 20 | 5 | 36 | 60 | 52 | 34 |
| 5 | 14 | 21 | 16 | 37 | 41 | 53 | 55 |
| 6 | 49 | 22 | 47 | 38 | 22 | 54 | 8 |
| 7 | 36 | 23 | 58 | 39 | 3 | 55 | 29 |
| 8 | 45 | 24 | 51 | 40 | 10 | 56 | 20 |
| 9 | 56 | 25 | 38 | 41 | 31 | 57 | 1 |
| 10 | 7 | 26 | 25 | 42 | 48 | 58 | 46 |
| 11 | 18 | 27 | 12 | 43 | 37 | 59 | 59 |
| 12 | 54 | 28 | 40 | 44 | 17 | 60 | 15 |
| 13 | 35 | 29 | 61 | 45 | 4 | 61 | 26 |
| 14 | 28 | 30 | 2 | 46 | 43 | 62 | 53 |
| 15 | 9 | 31 | 23 | 47 | 62 | 63 | 32 |

According to a second example of implementation, the method for generating a signal according to the invention comprises a step of selecting the transformation from several available transformations, the selection maximising the non-zero terms in equation 8 of the dispersion $\Delta(S_i, S_j)$.

In particular, in the case where the example of implementation proposed previously allows to construct several equivalent transformation functions, a selection step can be implemented, allowing to select the transformation function which maximises the non-zero values of the terms $$\left[(I_{S_{i,k}^m} - I_{S_{j,k}^m})^2 + \right.$$
$$\left. (Q_{S_{i,k}^m} - Q_{S_{j,k}^m})^2\right] + \left[(I_{T(S_i)_k^m} - I_{T(S_j)_k^m})^2 + (Q_{T(S_i)_k^m} - Q_{T(S_j)_k^m})^2\right]$$

Such a criterion indeed allows to guarantee that p-ary symbols which are close before transformation will be distant after transformation.

5.4 Performances

Some simulation results are presented below, allowing to measure the effect of the introduction of a transformation on the correction performances of a turbo-code, independently of the effect of the interleaving.

FIGS. 7A to 7C show the error rate (FER) as a function of the signal-to-noise ratio ($E_b/N_0$) for different simulations, when the order of modulation and turbo-code are the same.

To obtain these results, we consider:
- the structure of FIG. 2A, according to which the information symbols entering the first encoder C1 21A are neither interleaved nor transformed, and the information symbols entering the second encoder C2 22A are interleaved, then transformed;
- each coder C1 21A, C2 22A implements the same elementary code with a single memory element, as illustrated in FIG. 3A;
- the efficiency of the turbo-code is ⅓;
- the length of digital input messages is K=900 information symbols;
- the information symbols are defined on GF(64);
- the modulation is 64-QAM modulation;
- the length of the digital input messages expressed in bits is $K_b$=K×6=5400 bits of information.

For the results illustrated in FIGS. 7A and 7B, the elementary code adjustment parameters are for example: $a_1$=31, $a_2$=5 and $a_3$=18, and for the results illustrated in FIG. 7C, the elementary code adjustment parameters are for example: $a_1$=41, $a_2$=2 and $a_3$=0, and the code is constructed using the primitive polynomial $P(D)=1+D^2+D^3+D^5+D^6$.

Different transformations have been tested:
configuration 1: the transformation is the identity function (there is no transformation). In this case, for a 64-QAM modulation, we have:

$$\Delta_{min} = 2 \times \min_{(S_i, S_j) \in GF(q)^2} d_{euc}^2(S_i^m, S_j^m) = 8$$

configuration 2: the transformation T1 corresponds to a minimum dispersion value $\Delta_{min}$=12;
configuration 3: the transformation T2 corresponds to a minimum dispersion value $\Delta_{min}$=28, that is to say the greatest value of $\Delta_{min}$ found for a 64-QAM constellation.

The transformations T1 and T2 for the 64-QAM constellation in FIG. 5 are shown in Table 5.

A first simulation consisted of simulating a turbo-code whose interleaving function is the identity function. In other words, the information symbol sequences before and after interleaving are identical. In this case, no performance gain associated with interleaving ("interleaving gain") is expected.

The results of this first simulation are illustrated in FIG. 7A.

When no transformation is applied (curve 71A), the correction performances of the turbo-code are similar to those of the elementary convolutional code for which the transmission of the parity symbols is repeated.

When a transformation is inserted before coding by the second encoder C2 22A, for example the transformation T1 (curve 72A) or the transformation T2 (curve 72B), a coding gain is observed, which increases with the value of the minimum dispersion $\Delta_{min}$.

A second simulation consisted of simulating a turbo-code whose interleaving function is a random function (also called uniform interleaving). This is a probabilistic interleaver that allows to estimate the average turbo-code interleaving gain, independently of a particular interleaving pattern. The interleaver is randomly drawn for each message transmitted. The error rate curves thus obtained represent the performances of the code averaged over all the possible interleavers.

The results of this second simulation are illustrated in FIG. 7B.

Unlike the performances of FIG. 7A, here the presence of a coding gain linked to the interleaving can be observed. Also the error floor phenomenon is observed, which is characteristic of turbo-codes when the interleaving is not optimised. The position of the error floor on curves 72A (no transformation), 72B (with transformation T1) or 72C (with transformation T2) is given by the union bound of the turbo-code, according to the equation 1.

It can be seen in FIG. 7B that the introduction of a transformation allows to lower the error floor and to improve the correction power at a low error rate of the turbo-code, and especially when the minimum dispersion parameter $\Delta_{min}$ associated with the transformation is high. This confirms the increase in the minimum cumulative Euclidean distance of the turbo-code with the maximisation of the minimum dispersion parameter $\Delta_{min}$.

A third simulation consisted in simulating a turbo-code whose interleaving function is a conventional interleaving function, for example of the ARP type ("Almost Regular Interleaver").

The results of this third simulation are illustrated in FIG. 7C.

The same phenomena as in FIG. 7B are observed in FIG. 7C.

In particular, as the parameters a1=41, a2=2 and a3=0 of each elementary code (C1, C2) have been modified, the turbo-code obtained does not have good distance properties and has a floor error rate which is naturally high without transformation (curve 71C). It can be observed that the use of the transformation T2, in terms of dispersion, allows this floor error rate to be lowered by about 2 decades (curves 73C).

A similar phenomenon has also been observed for other elementary codes on GF(64) with the same transformations, as well as for codes defined on GF(16), associated with a 16-QAM modulation.

FIG. 8 illustrates the error rate (FER) as a function of the signal-to-noise ratio ($E_b/N_0$) for different simulations, when the order of modulation and turbo-code are different.

To obtain these results, we consider:
the structure of FIG. 2A, according to which the information symbols entering the first encoder C1 21A are neither interleaved nor transformed, and the information symbols entering the second encoder C2 22A are interleaved, then transformed;
each encoder C1 21A, C2 22A implements the same elementary code with a single memory element, as illustrated in FIG. 3A;
the length of the digital input messages is K=900 information symbols;
the information symbols are defined on GF(64);
the modulation is a QPSK modulation;
the length of the digital input messages expressed in bits is $K_b$=K×6=5400 information bits.

For the results illustrated in FIG. 8, the adjustment parameters of the elementary code are $a_1$=31, $a_2$=5 and $a_3$=18 and the code is constructed using the primitive polynomial $P(D)=1+D^2+D^3+D^5+D^6$.

Different transformations have been tested:
configuration 1: the transformation is the identity function (there is no transformation);
configuration 2: transformation T3 corresponds to a minimum dispersion value $\Delta_{min}$=16.

The transformation T3 is described in Table 7.

The turbo-code thus obtained was simulated for a transmission on a Gaussian channel, using a random interleaver. FIG. 8 shows the performance curves without implementation of a transformation (curve 81) and with implementation of the transformation T3 (curve 82), and it can be seen that the introduction of the transformation also allows in this context to significantly lower the error floor and improve the correction power at a low error rate of the turbo-code.

It is noted that in the above simulations, it was considered that the encoders C1 and C2 implement the same elementary code, for example that illustrated in FIG. 3A. Of course, these encoders can implement different codes, and in particular codes having different corrective power. In particular, only one systematic output is provided in the turbo-encoder.

5.5 Structure

Finally, in relation to FIG. 9, the simplified structure of a turbo-coder according to at least one embodiment described above is presented.

Such a turbo-encoder comprises at least one memory 91 comprising a buffer memory, at least one processing unit 92, equipped for example with a programmable computing machine or with a dedicated computing machine, for example a processor P, and controlled by the computer program 93, implementing steps of the method for generating a signal according to at least one embodiment of the invention.

Upon initialisation, the code instructions of the computer program 93 are for example loaded into a RAM memory before being executed by the processor of the processing unit 92.

The processor of the processing unit 92 implements steps of the method of generating a signal described above, according to the instructions of the computer program 93, to:
code a set of information symbols (either the input information symbols or the transformed information symbols) using a first code, delivering a first set of redundancy symbols,
interleave the set of information symbols (either the input information symbols or the transformed information symbols), delivering a set of interleaved information symbols,
code the set of interleaved information symbols (either the input information symbols or the transformed information symbols) using a second code, delivering a second set of redundancy symbols,
apply a bijective transformation to the information symbols (either the input information symbols or the interleaved information symbols), before and/or after the interleaving.

The invention claimed is:

1. A coding device comprising:
a turbo-encoder configured to receive an input digital message comprising a set of information symbols and configured to implement a non-binary turbo-code type error correcting code to encode the set of information symbols comprised in the input digital message, the information symbols belonging to a Galois field of cardinal q, denoted GF(q), with q>2, said turbo-encoder comprising:
a first encoder configured to code said set of information symbols and generate a first set of redundancy symbols;
an interleaver configured to interleave said set of information symbols and generate a set of interleaved information symbols;
a second encoder configured to code said set of interleaved information symbols and generate a second set of redundancy symbols; and
a processor configured to:
map the information and redundancy symbols onto modulation symbols associated with a constellation of order p, an information or redundancy symbol being mapped onto n modulation symbols, with n n≥2, the order p of the constellation being less than the cardinal q of the Galois field to which said information symbols belong;
apply a bijective transformation to said information symbols before and/or after said interleaver, said transformation modifying the value of at least two of said information symbols prior to the encoding of said information symbols by the first encoder and/or the second encoder, the bijective transformation being defined such that every input of a set of q elements of GF(q) has a unique output in the set of q elements of GF(q) by the bijective transformation and every output of the set of q elements of GF(q) has a unique antecedent in the set of q elements of GF(q), said transformation taking into account said constellation;

generate an output signal representing a code word which comprises the set of information symbols and the first and second sets of redundancy symbols; and transmit the output signal in a communication system.

2. A non-transitory computer-readable medium comprising instructions stored therein, which when executed by a processor of a coding device, configure the coding device to:

receive an input digital message comprising a set of information symbols;

turbo-code the set of information symbols comprised in the input digital message, the information symbols belonging to a Galois field of cardinal q, denoted GF(q), with q>2, wherein the turbo-coding implements a non-binary turbo-code type error correcting code to obtain redundancy symbols and comprises:

encoding said set of information symbols by a first encoder of the coding device to generate a first set of redundancy symbols;

interleaving said set of information symbols using an interleaver of the coding device to generate a set of interleaved information symbols;

encoding said set of interleaved information symbols by a second encoder of the coding device to generate a second set of redundancy symbols;

mapping the information and redundancy symbols onto modulation symbols associated with a constellation of order p, an information or redundancy symbol being mapped onto n modulation symbols, with n≥2, the order p of the constellation being less than the cardinal q of the Galois field to which said information symbols belong;

applying a bijective transformation to said information symbols using a processor of the coding device before and/or after said interleaving, said transformation modifying a value of at least two of said information symbols prior to the coding of said information symbols by the first encoder and/or the second encoder, the bijective transformation being defined such that every input of a set of q elements of GF(q) has a unique output in the set of q elements of GF(q) by the bijective transformation and every output of the set of q elements of GF(q) has a unique antecedent in the set of q elements of GF(q), said transformation taking into account said constellation;

generating an output signal representing a code word which comprises the set of information symbols and the first and second sets of redundancy symbols; and transmitting the output signal in a communications system.

3. A method performed by a coding device, the method comprising:

receiving an input digital message comprising a set of information symbols;

turbo-coding the set of information symbols comprised in the input digital message, the information symbols belonging to a Galois field of cardinal q, denoted GF(q), with q>2, wherein the turbo-coding implements a non-binary turbo-code type error correcting code to obtain redundancy symbols and comprises:

encoding said set of information symbols by a first encoder of the coding device to generate a first set of redundancy symbols;

interleaving said set of information symbols using an interleaver of the coding device to generate a set of interleaved information symbols;

encoding said set of interleaved information symbols by a second encoder of the coding device to generate a second set of redundancy symbols; and applying a bijective transformation to said information symbols using a processor of the coding device before and/or after said interleaving, said transformation modifying a value of at least two of said information symbols prior to the coding of said information symbols by the first encoder and/or the second encoder, the bijective transformation being defined such that every input of a set of q elements of GF(q) has a unique output in the set of q elements of GF(q) by the bijective transformation and every output of the set of q elements of GF(q) has a unique antecedent in the set of q elements of GF(q);

generating an output signal representing a code word which comprises the set of information symbols and the first and second sets of redundancy symbols; and transmitting the output signal in a communications system, wherein:

said transformation generates a minimum dispersion $\Delta_{min}$ between two information symbols $S_i$, $S_j$ among said information symbols greater than a selection threshold, such that:

$$\Delta_{min} = \min \Delta(S_i, S_j)$$

with:
$\Delta(S_i, S_j) = D(S_i, S_j) + D(T(S_i), T(S_j))$
$D(S_i, S_j)$ being a distance between said information symbols $S_i$, $S_j$ before transformation,
$D(T(S_i), T(S_j))$ being a distance between said information symbols $S_i$, $S_j$ after transformation by the function T;

the method comprises mapping the information and redundancy symbols onto modulation symbols associated with a constellation of order p equal to the cardinal q of the Galois field to which said information symbols belong, an information or redundancy symbol being mapped onto a single modulation symbol, and said transformation takes into account said constellation; and dispersion between two information symbols $S_i$, $S_j$ is expressed in the form:

$$\Delta(S_i, S_j) = d_{euc}^2(S_i^m, S_j^m) + d_{euc}^2(T(S_i)^m, T(S_j)^m)$$

with:
$d_{euc}^2(S_i^m, S_j^m) = (I_{S_i^m} - I_{S_j^m})^2 + (Q_{S_i^m} - Q_{S_j^m})^2$ being the square of the Euclidean distance between the modulation symbols $S_i^m$, $S_j^m$ onto which said information symbols $S_i$, $S_j$ are mapped before transformation;

$d_{euc}^2(T(S_i)^m, T(S_j)^m) = (I_{T(S_i)^m} - I_{T(S_j)^m})^2 + (Q_{T(S_i)^m} - Q_{T(S_j)^m})^2$ being the square of the Euclidean distance between the modulation symbols $T(S_i)^m$, $T(S_j)^m$ onto which said information symbols $S_i$, $S_j$ are mapped after transformation;

$I_x$ and $Q_x$ are the in-phase and quadrature components of a signal x in the considered constellation.

4. The method according to claim 3, wherein the said transformation transforms a pair of information symbols intended to be mapped onto a pair of modulation symbols whose Euclidean distance is less than a first threshold, into a pair of information symbols intended to be mapped onto a pair of modulation symbols whose Euclidean distance is greater than said first threshold.

5. The method according to claim 3, wherein said transformation transforms an information symbol intended to be mapped onto a modulation symbol having, in the constellation, a number of neighbouring modulation symbols less than a determined number, into an information symbol intended to be mapped onto a modulation symbol having, in the constellation, a number of neighbours greater than said determined number.

6. A method performed by a coding device, the method comprising:
- receiving an input digital message comprising a set of information symbols;
- turbo-coding the set of information symbols comprised in the input digital message, the information symbols belonging to a Galois field of cardinal q, denoted GF(q), with q>2, wherein the turbo-coding implements a non-binary turbo-code type error correcting code to obtain redundancy symbols and comprises:
  - encoding said set of information symbols by a first encoder of the coding device to generate a first set of redundancy symbols,
  - interleaving said set of information symbols using an interleaver of the coding device to generate a set of interleaved information symbols;
  - encoding said set of interleaved information symbols by a second encoder of the coding device to generate a second set of redundancy symbols; and
  - applying a bijective transformation to said information symbols using a processor of the coding device before and/or after said interleaving, said transformation modifying a value of at least two of said information symbols prior to the coding of said information symbols by the first encoder and/or the second encoder, the bijective transformation being defined such that every input of a set of q elements of GF(q) has a unique output in the set of q elements of GF(q) by the bijective transformation and every output of the set of q elements of GF(q) has a unique antecedent in the set of q elements of GF(q);
- generating an output signal representing a code word which comprises the set of information symbols and the first and second sets of redundancy symbols; and
- transmitting the output signal in a communications system, wherein:
the method comprises mapping the information and redundancy symbols onto modulation symbols associated with a constellation of order p, an information or redundancy symbol being mapped onto n modulation symbols, with n≥2, the order p of the constellation being less than the cardinal q of the Galois field to which said information symbols belong; and
said transformation takes into account said constellation.

7. The method according to the claim 6, wherein said transformation generates a minimum dispersion $\Delta_{min}$ between two information symbols $S_i$, $S_j$ among said information symbols greater than a selection threshold, such that:

$\Delta_{min} = \min \Delta(S_i, S_j)$ with:
$\Delta(S_i, S_j) = D(S_i, S_j) + D(T(S_i), T(S_j))$
$D(S_i, S_j)$ being a distance between said information symbols $S_i$, $S_j$ before transformation,
$D(T(S_i), T(S_j))$ being a distance between said information symbols $S_i$, $S_j$ after transformation by the function T.

8. The method according to claim 7, wherein
the dispersion between two information symbols $S_i$, $S_j$ is expressed in the form:

$\Delta(S_i, S_j) = D(S_i, S_j) + D(T(S_i), T(S_j))$ with:

$$D(S_i, S_j) = \sum_{k=1}^{n} d^2_{euc}(S^m_{i,k}, S^m_{j,k}) = \sum_{k=1}^{n}\left[\left(I_{S^m_{i,k}} - I_{S^m_{j,k}}\right)^2 + \left(Q_{S^m_{i,k}} - Q_{S^m_{j,k}}\right)^2\right]$$

$$D(T(S_i), T(S_j)) = \sum_{k=1}^{n} d^2_{euc}(T(S_i)^m_k, T(S_j)^m_k)$$
$$= \sum_{k=1}^{n}\left[\left(I_{T(S_i)^m_k} - I_{T(S_j)^m_k}\right)^2 + \left(Q_{T(S_i)^m_k} - Q_{T(S_j)^m_k}\right)^2\right]$$

$S^m_{i,k}$ respectively $S^m_{j,k}$, for k ranging from 1 to n, the n modulation symbols associated with the information symbol $S_i$, respectively $S_j$, before transformation,
$T(S_i)^m_k$, respectively $T(S_j)^m_k$, for k ranging from 1 to n, the n modulation symbols associated with the information symbol $S_i$, respectively $S_j$, after transformation,
$I_x$ and $Q_x$ are the in-phase and quadrature components of a signal x in the considered constellation.

9. The method according to claim 8, wherein said transformation minimises the number of zero terms in the expression of the dispersion $\Delta(S_i, S_j)$.

10. The method according to claim 8, wherein the method comprises selecting said transformation from several available transformations, said selection maximising the value of the non-zero terms in the expression of the dispersion $\Delta(S_i, S_j)$.

\* \* \* \* \*